US 7,894,921 B2

(12) United States Patent
John et al.

(10) Patent No.: US 7,894,921 B2
(45) Date of Patent: Feb. 22, 2011

(54) DEVICE AND METHOD FOR PRODUCING A THREE-DIMENSIONAL OBJECT BY MEANS OF MASK EXPOSURE

(75) Inventors: Hendrik John, Hünxe (DE); Volker Schillen, Düsseldorf (DE); Ali El-Siblani, Dearborn Heights, MI (US)

(73) Assignee: Envisiontec GmbH, Gladbeck (DE)

( * ) Notice: Subject to any disclaimer, the term of this patent is extended or adjusted under 35 U.S.C. 154(b) by 835 days.

(21) Appl. No.: 11/796,745

(22) Filed: Apr. 26, 2007

(65) Prior Publication Data
US 2007/0260349 A1    Nov. 8, 2007

Related U.S. Application Data

(60) Provisional application No. 60/796,160, filed on Apr. 28, 2006.

(30) Foreign Application Priority Data

Apr. 28, 2006   (DE)   ................  10 2006 019 964

(51) Int. Cl.
G06F 19/00    (2006.01)
(52) U.S. Cl. .................................... 700/95; 700/117
(58) Field of Classification Search ............. 700/95–98, 700/117–121; 264/497
See application file for complete search history.

(56) References Cited

U.S. PATENT DOCUMENTS

| 4,837,379 A | 6/1989 | Weinberg |
| 4,929,402 A | 5/1990 | Hull |
| 4,999,143 A | 3/1991 | Hull et al. |
| 5,093,130 A | 3/1992 | Fujii et al. |

(Continued)

FOREIGN PATENT DOCUMENTS

DE    41 05 314    8/1991

(Continued)

OTHER PUBLICATIONS

Burns, "Automated Fabrication—Improving Productivity in Manufacturing" ISBN 0-13-119462-3, pp. VIII-XI, 40-67, 87-88, 192-231, 259-266, 1993.

(Continued)

*Primary Examiner*—Kidest Bahta
(74) *Attorney, Agent, or Firm*—Hansen IP Law PLLC

(57) ABSTRACT

The invention describes device and method for producing a three-dimensional object by solidifying a solidifiable material under an action of electromagnetic radiation by means of energy input via an imaging unit comprising a predetermined number of discrete imaging elements (pixels). The energy input related to a specific cross-sectional area of the three-dimensional object is controlled by exposure by means of multiple successive raster masks (bitmaps; e.g. bitmap 1 and bitmap 2 and possibly additional ones). The imaging unit is suitably controllable such that at least two masks can be generated, including a first overall mask covering the cross-sectional area (bitmap 1; with pixel-specific area elements exposing in white light) and a partial mask (bitmap 2; in which only a fraction of the area elements are exposed pixel-specifically with white light) within the overall mask. A voxel matrix may be formed. A hardness depth per voxel (volume pixel) can be specifically and precisely influenced in the solidifyable material.

20 Claims, 5 Drawing Sheets

Bitmap 1

U.S. PATENT DOCUMENTS

| | | | |
|---|---|---|---|
| 5,137,662 A | 8/1992 | Hull et al. | |
| 5,139,338 A | 8/1992 | Pomerantz et al. | |
| 5,143,663 A | 9/1992 | Leyden et al. | |
| 5,157,423 A | 10/1992 | Zur | |
| 5,171,490 A | 12/1992 | Fudim | |
| 5,173,266 A | 12/1992 | Kenney | |
| 5,174,931 A | 12/1992 | Almquist et al. | |
| 5,236,637 A | 8/1993 | Hull | |
| 5,247,180 A | 9/1993 | Mitcham et al. | |
| 5,248,456 A | 9/1993 | Evans, Jr. et al. | |
| 5,263,130 A | 11/1993 | Pomerantz et al. | |
| 5,268,994 A | 12/1993 | Keskes | |
| 5,289,214 A | 2/1994 | Zur | |
| 5,298,208 A | 3/1994 | Sibley et al. | |
| 5,306,446 A | 4/1994 | Howe | |
| 5,345,391 A | 9/1994 | Hull et al. | |
| 5,360,981 A | 11/1994 | Owen et al. | |
| 5,391,072 A | 2/1995 | Lawton et al. | |
| 5,447,822 A | 9/1995 | Hull et al. | |
| 5,510,077 A | 4/1996 | Dinh et al. | |
| 5,529,473 A | 6/1996 | Lawton et al. | |
| 5,545,367 A | 8/1996 | Bae et al. | |
| 5,569,431 A | 10/1996 | Hull | |
| 5,571,471 A | 11/1996 | Hull | |
| 5,630,981 A | 5/1997 | Hull | |
| 5,651,934 A | 7/1997 | Almquist et al. | |
| 5,653,925 A | 8/1997 | Batchelder | |
| 5,823,778 A | 10/1998 | Schmitt et al. | |
| 5,858,746 A | 1/1999 | Hubbell et al. | |
| 5,891,382 A | 4/1999 | Almquist et al. | |
| 5,894,036 A | 4/1999 | Tylko | |
| 5,902,537 A | 5/1999 | Almquist et al. | |
| 5,945,058 A * | 8/1999 | Manners et al. | 264/401 |
| 5,980,813 A | 11/1999 | Narang et al. | |
| 6,013,099 A | 1/2000 | Dinh et al. | |
| 6,027,324 A | 2/2000 | Hull | |
| 6,048,487 A | 4/2000 | Almquist et al. | |
| 6,051,179 A | 4/2000 | Hagenau | |
| 6,153,034 A | 11/2000 | Lipsker | |
| 6,158,946 A | 12/2000 | Miyashita | |
| 6,171,610 B1 | 1/2001 | Vacanti et al. | |
| 6,280,727 B1 | 8/2001 | Prior et al. | |
| 6,281,903 B1 | 8/2001 | Martin et al. | |
| 6,334,865 B1 | 1/2002 | Redmond et al. | |
| 6,352,710 B2 | 3/2002 | Sawhney et al. | |
| 6,391,245 B1 * | 5/2002 | Smith | 264/401 |
| 6,500,378 B1 | 12/2002 | Smith | |
| 6,508,971 B2 * | 1/2003 | Leyden et al. | 264/401 |
| 6,547,552 B1 | 4/2003 | Fudim | |
| 6,630,009 B2 | 10/2003 | Moussa et al. | |
| 6,764,636 B1 | 7/2004 | Allanic et al. | |
| 6,828,068 B2 * | 12/2004 | Progler et al. | 430/5 |
| 6,833,231 B2 | 12/2004 | Moussa et al. | |
| 6,833,234 B1 | 12/2004 | Bloomstein et al. | |
| 6,942,830 B2 | 9/2005 | Mülhaupt et al. | |
| 6,974,656 B2 | 12/2005 | Hinczewski | |
| 6,989,225 B2 | 1/2006 | Steinmann | |
| 6,995,830 B2 * | 2/2006 | de Jager | 355/53 |
| 7,006,887 B2 * | 2/2006 | Nagano et al. | 700/120 |
| 7,052,263 B2 | 5/2006 | John | |
| 7,073,883 B2 | 7/2006 | Billow | |
| 7,083,405 B2 * | 8/2006 | Koyagi et al. | 425/174.4 |
| 7,133,041 B2 | 11/2006 | Kaufman et al. | |
| 7,195,472 B2 | 3/2007 | John | |
| 7,215,430 B2 | 5/2007 | Kacyra et al. | |
| 7,261,542 B2 | 8/2007 | Hickerson et al. | |
| 7,467,939 B2 | 12/2008 | Sperry et al. | |
| 7,568,904 B2 * | 8/2009 | Koyagi et al. | 425/375 |
| 7,573,561 B2 * | 8/2009 | Fries | 355/67 |
| 7,790,093 B2 | 9/2010 | Shkolnik et al. | |
| 2001/0028495 A1 | 10/2001 | Quate et al. | |
| 2001/0048183 A1 | 12/2001 | Fujita | |
| 2002/0028854 A1 | 3/2002 | Allanic et al. | |
| 2002/0155189 A1 | 10/2002 | John | |
| 2003/0067539 A1 | 4/2003 | Doerfel et al. | |
| 2003/0074096 A1 | 4/2003 | Das et al. | |
| 2003/0205849 A1 | 11/2003 | Farnworth | |
| 2004/0008309 A1 | 1/2004 | Yamahara et al. | |
| 2005/0023710 A1 | 2/2005 | Brodkin et al. | |
| 2005/0084766 A1 * | 4/2005 | Sandstrom | 430/5 |
| 2005/0208168 A1 | 9/2005 | Hickerson et al. | |
| 2005/0248061 A1 | 11/2005 | Shkolnik et al. | |
| 2005/0248062 A1 | 11/2005 | Shkolnik et al. | |
| 2005/0288813 A1 | 12/2005 | Yang et al. | |
| 2006/0055724 A1 * | 3/2006 | Krawczyk et al. | 347/20 |
| 2006/0078638 A1 | 4/2006 | Holmboe et al. | |
| 2006/0192312 A1 | 8/2006 | Wahlstrom | |
| 2006/0239588 A1 | 10/2006 | Hull et al. | |
| 2006/0249884 A1 | 11/2006 | Partanen et al. | |
| 2007/0074659 A1 | 4/2007 | Wahlstrom | |
| 2007/0075458 A1 | 4/2007 | Wahlstrom et al. | |
| 2007/0075459 A1 | 4/2007 | Reynolds et al. | |
| 2007/0075460 A1 | 4/2007 | Wahlstrom et al. | |
| 2007/0075461 A1 | 4/2007 | Hunter et al. | |
| 2007/0077323 A1 | 4/2007 | Stonesmith et al. | |
| 2007/0120842 A1 | 5/2007 | Hess | |
| 2007/0257055 A1 | 11/2007 | Scott et al. | |
| 2007/0259066 A1 | 11/2007 | Sperry et al. | |
| 2008/0038396 A1 | 2/2008 | John et al. | |
| 2008/0054531 A1 | 3/2008 | Kerekes et al. | |
| 2008/0055581 A1 * | 3/2008 | Rogers et al. | 355/95 |
| 2008/0169586 A1 | 7/2008 | Hull et al. | |
| 2008/0169589 A1 | 7/2008 | Sperry et al. | |
| 2008/0170112 A1 | 7/2008 | Hull et al. | |
| 2008/0179786 A1 | 7/2008 | Sperry et al. | |
| 2008/0179787 A1 | 7/2008 | Sperry et al. | |
| 2008/0181977 A1 | 7/2008 | Sperry et al. | |
| 2008/0206383 A1 | 8/2008 | Hull et al. | |
| 2008/0217818 A1 | 9/2008 | Holmboe et al. | |
| 2008/0226346 A1 | 9/2008 | Hull et al. | |
| 2008/0231731 A1 | 9/2008 | Hull | |
| 2008/0309665 A1 | 12/2008 | Gregory, II | |

FOREIGN PATENT DOCUMENTS

| | | |
|---|---|---|
| DE | 41 02 257 | 7/1992 |
| DE | 41 25 534 A1 | 2/1993 |
| DE | 93 19 405 | 5/1994 |
| DE | G 93 19 405.6 | 5/1994 |
| DE | 43 40 108 | 8/1997 |
| DE | 197 27 554 | 1/1999 |
| DE | 299 11 122 | 11/1999 |
| DE | 299 11 122 U1 | 11/1999 |
| DE | 198 38 797 | 3/2000 |
| DE | 199 29 199 A1 | 1/2001 |
| DE | 100 03 374 | 8/2001 |
| DE | 100 18 987 | 10/2001 |
| DE | 201 06 887 | 10/2001 |
| DE | 699 09 136 T2 | 5/2004 |
| EP | 0 250 121 | 12/1987 |
| EP | 0 426 363 | 5/1991 |
| EP | 0 435 564 A2 | 7/1991 |
| EP | 0 466 422 A1 | 1/1992 |
| EP | 0 484 086 A1 | 5/1992 |
| EP | 1 250 995 | 10/2002 |
| EP | 1 250 997 A1 | 10/2002 |
| EP | 1 270 185 | 1/2003 |
| EP | 1 192 041 B1 | 3/2003 |
| EP | 1 156 922 B1 | 6/2003 |
| EP | 1 338 846 | 8/2003 |
| EP | 1674243 A2 | 6/2006 |
| EP | 1 849 587 | 10/2007 |
| EP | 1 880 830 | 1/2008 |
| EP | 1 894 704 | 3/2008 |

| EP | 1 950 032 | 7/2008 |
| EP | 2 011 631 | 1/2009 |
| FR | 2 254 194 | 7/1975 |
| FR | 2 583 334 | 12/1986 |
| FR | 2 634 686 | 2/1990 |
| FR | 2 692 053 | 12/1993 |
| JP | 04371829 | 12/1992 |
| JP | 08192469 | 7/1996 |
| WO | WO 95/11007 | 4/1995 |
| WO | WO-96/00422 | 1/1996 |
| WO | WO 01/00390 | 1/2001 |
| WO | WO-01/00390 A1 | 1/2001 |
| WO | WO-01/12679 | 2/2001 |
| WO | WO-01/72501 A1 | 10/2001 |
| WO | WO-03/059184 | 7/2003 |
| WO | WO 2005/110722 | 11/2005 |
| WO | WO-2005/110722 A1 | 11/2005 |

OTHER PUBLICATIONS

Wohlers Report 2000, "Rapid Prototyping & Tooling State of the Industry Annual Worldwide Progress Report", T. Wohlers, Wohlers Association, Inc., Fort Collins, Colorado (2000).

Stark, G.B., et al., "Biological Matrices and Tissue Reconstruction", Springer Publications, Berlin (1998).

Sachs, E., et al., "Three Dimensional Printing: Rapid Tooling and Prototypes Directly from CAD Model", Journal of Engineering for Industry, 114:481-488 (1992).

Kuhtreiber, W., Ph.D., et al., "Cell Encapsulation Technology and Therapeutics", Birkhauser, Boston (1998).

Landers, R., and Mulhaupt, R., "Desktop Manufacturing of Complex Objects, Prototypes and Biomedical Scaffolds by Means of Computer-Assisted Design Combined with Computer-Guided 3D Plotting of Polymers and Reactive Oligomers," Macromolecular Materials and Engineering, 282:17-22 (2000).

Okada, T., and Ikada, Y., "Tissue Reactions to Subcutaneously Implanted, Surface-Modified Silicones", Journal of Biomedical Materials Research, 27:1509-1518 (1993).

Relou, I.A., et al., "Effect of Culture Conditions on Endothelial Cell Growth and Responsiveness", Tissue & Cell, 30(5):525-538 (1998).

Nikolaychik, V.V., et al., A New, Cryopreciptate Based Coating for Improved Endothelial Cell Attachment and Growth on Medical Grade Artificial Surfaces:, ASAIO Journal, 40:M846-M852 (1994).

Burns, "Automatic Fabrication Improving Productivity in Manufacturing", 1993 (ISBN 0-13-119462-3).

Notice of Allowance for U.S. Appl. No. 11/796,709.

Opposition to EP 1,849,587, dated Apr. 8, 2010.

C. Sun, et al., "Projection Micro-Stereolithography Using Digital Micro-Mirror Dynamic Mask," Sensors and Actuators A 121 (2005) 113-120.

S. Ventura, et al., "Freeform Fabrication of Functional Silicon Nitride Components by Direct Photoshaping," Mat. Res. Soc. Symp. Proc., vol. 625 (2000).

K. Takahashi, "A New Application of DMD to Photolithography and Rapid Prototyping System," Institute of Electronics, Information, and Communication Engineers.

Notice of Allowance, dated Jun. 30, 2010 for U.S. Appl. No. 12/284,567.

Issue Fee Transmittal, dated Sep. 24, 2010 for U.S. Appl. No. 12/284,567.

* cited by examiner

Bitmap 1

Bitmap 2

Bitmap 1

Bitmap 2

Bitmap 1

Bitmap 2

Voxel-Matrix

Bitmap 1

Bitmap 2

DEVICE AND METHOD FOR PRODUCING A THREE-DIMENSIONAL OBJECT BY MEANS OF MASK EXPOSURE

TECHNICAL FIELD

The invention relates to a device and a method for producing a three-dimensional object by solidification of a solidifiable material under the action of electromagnetic radiation by means of energy input via an imaging unit comprising a specific number of discrete imaging elements (pixels). In particular, this invention relates to devices and methods in which the solidification of the material is based on the exposure by means of a raster mask, with the smallest physical resolution in the mask given by the size of a pixel and the Spatial Light Modulator (SLM) technology being applied for the imaging unit.

BACKGROUND ART

The literature specifies highly varying methods for the construction of three-dimensional objects of "light—hardening" photopolymers, cf. "Automated Fabrication—Improving Productivity in Manufacturing" by Marshall Burns, 1993 (ISBN 0-13-119462-3).

Known possibilities are, inter alia, the exposure by
a) multimedia projector
b) LC display (reflexive, transmissive)
c) LED or laser diode line (which is moved over an area orthogonally to the line)
d) light valve technology (MEMS).

These methods are described in the following patents:

US Patent US005247180A "Stereolithographic Apparatus and Method of use" by Texas Instruments Inc., September 1993;

US Patent US005980813A "Rapid Prototyping using multiple materials" by SRI International, November 1999;

Utility model publication DE G 93 19 405.6 "Device for the production of a three-dimensional object (model) according to the principle of photo solidification" by the Research Center Informatics at the University of Karlsruhe, December 1993;

According to a similar method, the utility model publication DE 299 11 122 U1 "Device for producing a three-dimensional object", DeltaMed inter alia, June 1999 describes an application for the generation of micro-technical, three-dimensional components.

EP 1250997A (=US2002155189A) "Device for producing a three-dimensional object" by Envision Technologies GmbH, April 2002.

German Patent DE69909136T "Rapid Prototyping Device and Rapid Prototyping Method", July 2003 (equivalent: European Patent EP 1156922 "Rapid Prototyping Apparatus and Method of Rapid Prototyping", August 2003) of DICON AS Lystrup, Denmark.

WO 01/00390 A by HAP, Sitec Industrietechnologie and DELTAMED Medizinprodukte GmbH.

WO 2005/110722 A of Envisiontec GmbH.

With laser-based systems for photo-polymerization, the light output in the exposure point is provided by the energy setting of the laser beam, whereby the hardening depth of the photopolymer can be controlled in that point. To selectively harden a corresponding layer, the laser beam is scanned over the cross-sectional surface to be correspondingly hardened.

The contours of the cross-sectional surface to be hardened can be scanned by the laser beam as a curve.

With systems for photo-polymerization based on mask projection by means of projection systems with the SLM technology, the advantage is that an entire cross-sectional area can be exposed at once. The light areas of the projected raster image harden the photopolymer voxel by voxel.

The disadvantage in projection systems with SLM technology is that the light output distribution over the image surface can be very inhomogeneous (up to 50% absolute), depending on
a) the light source used;
b) the optical system for coupling the light energy to the SLM; and
c) by the vignetting of the projection optics.

The change of the properties of the light source over the service life will result in a variable error and thus in a changing homogeneity distribution.

Moreover, a change of the light intensity of the light source does not result in a selective change as with a laser but would affect the entire projection image.

A constant error is concerned in case of homogeneity deviations caused by the optical system for coupling the light energy to the SLM and the projection optics.

The contours of the cross-sectional surface to be hardened can only be presented in rasters; the resolution depends on the number of image points/pixels and on the size of the projected image.

Moreover, the light intensity varies depending on the size of the exposed surface structure (higher light intensity with larger, contiguous surfaces; lower light intensity with smaller, filigree surface structures).

With the above mentioned WO 01/00390 A, the intensity of beams is controlled by controlling the permeability of the mask, wherein the intensity may be controlled via the selection of gray levels of a transmission LCD.

In WO 2005/110722 A, a multiple exposure is carried out on the subpixel level per layer for improving the resolution along the outside and inside contours of the cross-sectional areas of the object to be generated, said exposure consisting of a sequence of a plurality of images offset on the subpixel level in the image/building plane, wherein a separate mask/bitmap is generated for every offset image.

Neither WO 01/00390 A nor WO 2005/110722 show how the resolution and the fine adjustment in the image plane can be improved and how native inhomogeneities of the light source can be balanced better.

OBJECT OF THE INVENTION

It is the object of the invention to improve device and method for the production of a three-dimensional object by solidification of a material solidifiable under the action of electromagnetic radiation, by means of energy input via an imaging unit comprising a prescribed number of discrete imaging elements (pixels) so that a higher precision, higher resolution and fine adjustment and/or a higher homogeneity of the system will be realized.

Solution of the Problem

According to the present invention, a device for producing a three-dimensional object is provided, the device comprising: an imaging unit comprising a predetermined number of discrete imaging elements (pixels) for energy input capable of solidifying a solidifyable material under an action of electromagnetic radiation; a computer unit, an IC and/or a software implementation; wherein the computer unit, the IC and/or the software implementation respectively has the ability of controlling the energy input with respect to a cross-sectional area of a three-dimensional object to be produced by exposure by means of multiple successive raster masks (bitmaps).

According to the present invention, there is also provided a device for producing a three-dimensional object, the device comprising: raster imaging unit comprising a predetermined number of discrete imaging elements (pixels) arranged as point, line or matrix, wherein the imaging unit composes, from the pixels, an image related to a specific cross sectional area of the three-dimensional object to be produced and thus forms a raster mask (bitmap); wherein the imaging unit is designed to provide energy input for solidifying a solidifiable material under an action of electromagnetic radiation; wherein the imaging unit is arranged to be controlled such that at least two masks can be generated, including: a first overall mask (bitmap 1) covering the cross-sectional area; and a partial mask (bitmap 2) within the overall mask.

The present invention also provides a method for producing a three-dimensional object, the method comprising: providing an imaging unit comprising a predetermined number of discrete imaging elements (pixels); solidifying a solidifyable material in a matrix of volume pixels (voxels) under an action of electromagnetic radiation by means of energy input via the imaging unit; wherein an energy input, with respect to a cross-sectional area of the three-dimensional object to be produced, for the solidification of a volume pixel in the material to be hardened is controlled by a succession of multiple raster bitmaps to influence the hardening depth per voxel (volume pixel) in the solidifyable material.

The present invention further provides a method for producing a three-dimensional object, the method comprising: providing imaging unit comprising a predetermined number of discrete imaging elements (pixels); solidifying a solidifiable material under an action of electromagnetic radiation by means of energy input via the imaging unit; wherein the imaging unit composes, from the pixels, an image related to a cross-sectional area of the three-dimensional object and thus forms a raster mask (bitmap), wherein at least two masks are used per cross-sectional area of the three-dimensional object, including: a first overall mask (bitmap 1) covering the cross-sectional area; and a partial mask (bitmap 2) within the overall mask.

DESCRIPTION OF THE PREFERRED EMBODIMENTS AND THE ADVANTAGES OF THE INVENTION

Figure 1A:
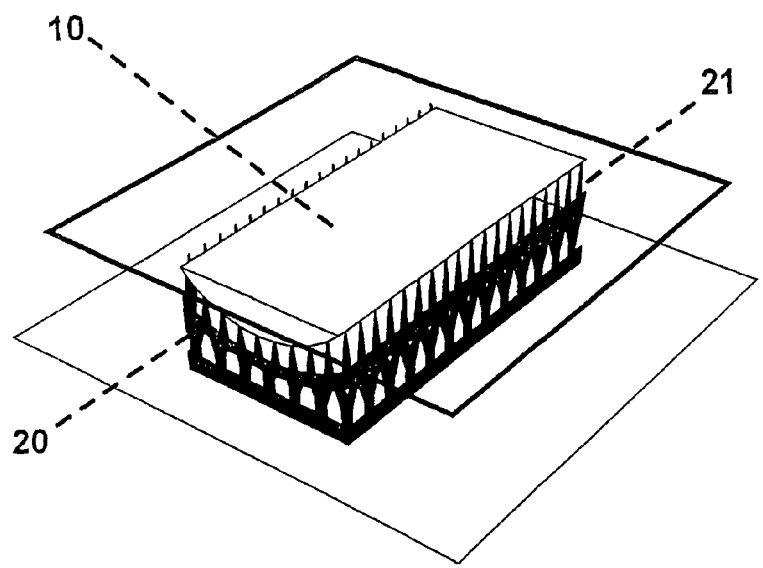
FIGS. 1A to 1C schematically show an example of the principle of the invention with using multiple bitmaps relative to a specific cross-sectional area, wherein FIG. 1A illustratively exemplifies a support structure to be produced, and FIGS. 1B and 1C respectively show bitmaps 1 and 2 to be used for generating support structures.

The invention will be described in more detail on the basis of further exemplary embodiments with reference to the attached Figures; however, the invention is by no means limited to the described embodiments and examples and drawings but can instead comprise any variations and modifications within the scope of the claims.

Device and method according to the invention allow to remove the inhomogeneities in the image level and thus achieve higher precision, higher resolution and fine adjustment.

It is possible with the invention to control, on the one hand, the hardening depth of a voxel in the material to be hardened by means of light output control on a pixel level, and on the other hand, selective portions of the cross-sectional area to be hardened can be specifically overexposed per cross-sectional area without changing the properties of the imaging unit including the light source, by selectively exposing—per building plane/exposure cycle—through one or several successive digital masks (bitmaps), wherein furthermore the BLACK/WHITE raster (or, respectively, LIGHT/DARK raster and/or COLOR raster) within the mask may preferably be different from mask to mask and/or the exposure times per mask may be varied.

Due to the exposure by means of a raster mask, a matrix of so-called voxels (volume pixels) will be hardened in the material to be hardened, wherein the XY raster is predetermined by the size, number and arrangement of the pixels, and the height (=hardening depth) of the voxels in the material can be controlled by the multiple exposure. Furthermore, in preferred embodiments, the light intensity and/or the spectrum can be controlled specifically via the gray value and/or the color value (the latter through the wavelength or the wavelength range of the electromagnetic radiation) per pixel.

In accordance with the invention and depending on the requirement, special portions of the structure to be generated—i.e. only within the cross-sectional area to be hardened—can be identified and selected. In accordance with the invention, an energy input can be very efficiently influenced in relation to a specific cross-sectional area—defined by its contours—of the three-dimensional object. Most suitably, within a cross-sectional area defined by a first bitmap, a second bitmap—or further bitmaps—is generated, wherein the first and second (and possibly additional) bitmaps are superposed by multiple exposure. The second bitmap and the possibly additional bitmaps then respectively form partial masks within an overall mask formed by the first bitmap. In accordance with the invention, the terms "partial mask" and "within the overall mask" typically mean that—compared with the overall mask, relative to the same or a smaller cross-sectional area thereof—a smaller or several smaller area(s) is (are) exposed. Second and possibly additional bitmaps need not be identical but can be varied as desired within the overall mask of the first bitmap. Thus, the partial masks formed in addition to the overall mask can be identical or different, or different sub-partial masks can be formed.

According to the invention, a VOXEL matrix can be generated by multiple exposure within a predetermined, defined overall image area of the building plane. An offsetting of images in the building level per cross-sectional area can be advantageously dispensed with. By means of a voxel matrix formation, e.g. a supporting structure, overhangs and/or particularly small/filigree portions can be formed significantly finer and more accurately.

The sequence of use of the overall mask and the partial mask(s) can be randomly selected, i.e. "first", "second"and "additional" bitmaps does not specify any time sequence but merely designates different bitmaps of the multiple mask exposure. Most suitably, however, the first bitmap is first used with the overall mask. The respective bitmaps can be generated via the corresponding software algorithms. Exposure times per overall mask and per partial mask can be additionally controlled independently from each other by an electro-mechanical shutter.

By means of the multiple mask exposure according to the invention, the hardening depth of every single voxel can be pixel-precisely controlled so that, overall, the quality of the constructed component with regard to surface quality, green compact hardness, accuracy in every detail, and tolerances can be improved, and the condition of necessary supporting structures can also be optimized.

The multiple mask exposure according to the invention also allows an "overexposure" in selected areas of the voxel matrix to be hardened which would not be possible via a mere gray value scaling within the bitmap since a gray value adjustment will principally eliminate light energy at least partially, which is basically undesirable. Yet, for further fine adjustment, it can be of particular advantage to perform gray value and/or color value adjustments within the first, the second, and/or the further bitmaps. Additional fine adjustment can be achieved thereby, while limiting simultaneously the number of bitmaps within the overall mask which would be necessary—without gray value and/or color value adjustment—for reaching an identical fine adjustment. The gray value and/or the color value adjustment can be done pixel-specific with individual pixels or a part of the pixels per bitmap or, respectively, partial bitmap.

A clever selection and sequence of masks for partial exposure within an exposure cycle per cross-sectional area, particular exposure strategies can be realized—e.g. for hardening of overhangs, overexposure of filigree structures and material accumulations, reduction of material shrinkage within a building plane, etc.

The generation of the further exposure masks will be technically preferably accomplished entirely by software, and it is thus very flexible and applicable for all mask projection systems based on SML technology.

According to a particular embodiment of the invention, additional parameters can be stored and applied—by means of an additional gray value and/or color channel coding of the bitmap on a pixel level—which influence the hardening depth of the voxel in the hardenable material; this includes influencing a) the light intensity by the brightness value (gray values from white=255 to black=0), and b) the spectrum (initiator and absorption behavior) through the color information.

Due to the gray value and/or color channel coding of an individual pixel, it is possible to make a fine correction of the exposure parameters within the bitmap.

An additional control parameter is offered by an individual exposure time per bitmap which can be controlled by a shutter. Only when the digital image has been completely built up by the imaging unit, the shutter will be opened and subsequently closed again.

The principle of the present invention with respect to device and method is applicable to various types or manners of producing a three-dimensional object. The building or construction may be carried out in layers (layer-wise), however alternatively independently from layers. Other design options are possible. For example, the hardening process can be carried out continuously without layers; discontinuously (either with same or different or variable layer thicknesses); partially continuously and partially discontinuously (discontinuously either with same or different or variable layer thicknesses); or in a combination of various possibilities. The device and process according to the present invention is particularly suitable for building a three-dimensional object in a voxel matrix independent from layers.

Further, using multiple bitmaps, or the application of first and second or further rastered masks, per cross-sectional area may be used for one or more cross-sectional area(s) of the three-dimensional object to be produced.

EXAMPLES OF THE APPLICATION

Overexposure of Supporting Structures

As illustrated schematically in FIG. 1A, it is an important objective to minimize supporting structures 20 in general and in particular their contact points 21 to the constructed component 10. This can be done by the supporting structure 20 gaining—during the building process—a higher inherent strength due to a higher degree of polymerization, which in turn can be achieved by an overexposure by means of the application of the concept in accordance with the invention.

Figure 1B:
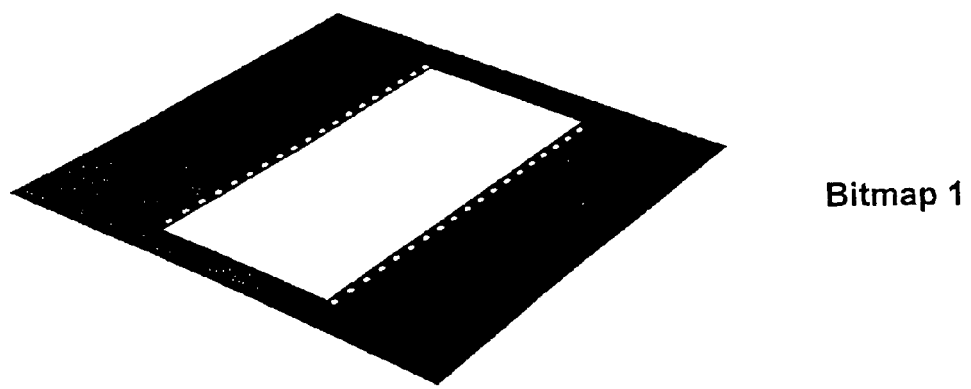
Figure 1C:
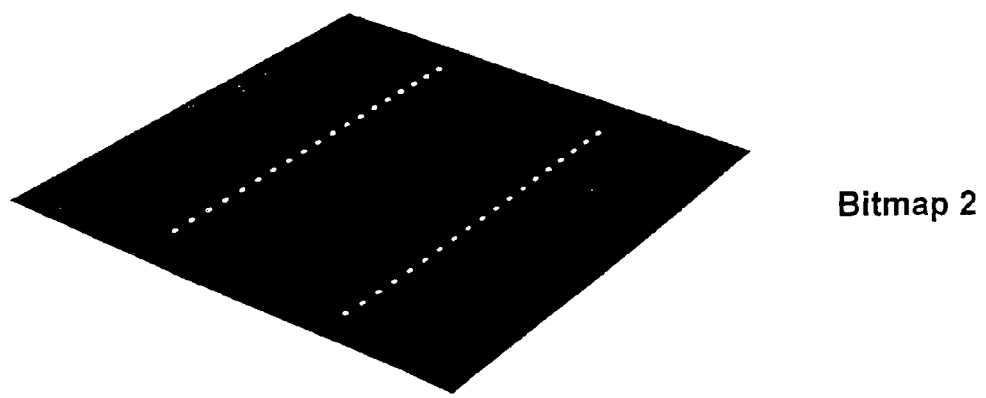

Based on the data structure, it is possible for respective cross-sectional areas within the entire component (in FIG. 1A in a perspective view schematically indicated by the upper cross-sectional surface)—to distinguish supporting structure data from component data and thus—only for the bitmap areas of the supporting structures 20 and/or selectively for the contact points 21—to generate an additional partial bitmap 2 within the overall bitmap 1 (covering the entire cross-sectional area), bitmap 2 being connected in series to the first bitmap 1 with a defined, i.e. identical or different exposure time in relation to the first mask exposure and being superposed on it to thus achieve an over/post-exposure only in the area of the supporting structures (FIGS. 1B and 1C).

Hardening Depth with Large Versus Filigree Cross-sectional Area Structures/Overexposure of Filigree Structures With larger structures, more light output per area will be available than with filigree structures; this phenomenon results in a different hardening in xy-expansion (beyond the contour) and z-expansion (depth) per cross-sectional area.

If, for example, a 10 mm×10 mm large area is exposed once, it will harden e.g. to a thickness of 130 µm; a structure of 2 mm×10 mm instead will harden only 100 µm with the same exposure time. If the component is now built e.g. in layers of 100 µm, it may happen that, in the filigree portion, the generated layers do not enter into sufficient chemical bonding due to overexposure (130 µm depth hardening up to 30% into the previous layer), that the layers will separate in this portion, and that the component is defective. This phenomenon is particularly critical with filigree supporting structures.

Figure 2A:
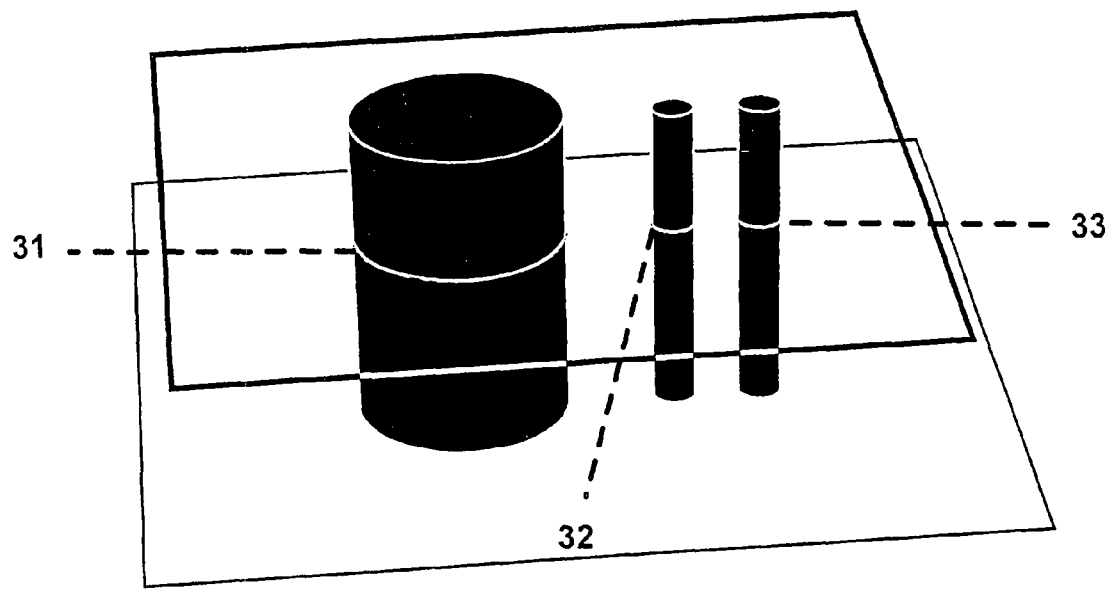
FIGS. 2A to 2C schematically show an example of the principle of the invention with using multiple bitmaps relative to a specific cross-sectional area, wherein FIG. 2A illustratively exemplifies a structure to be produced comprising a relatively large cross-sectional area, and FIGS. 2B and 2C respectively show bitmaps 1 and 2 to be used per cross-sectional area.
Figure 2B:
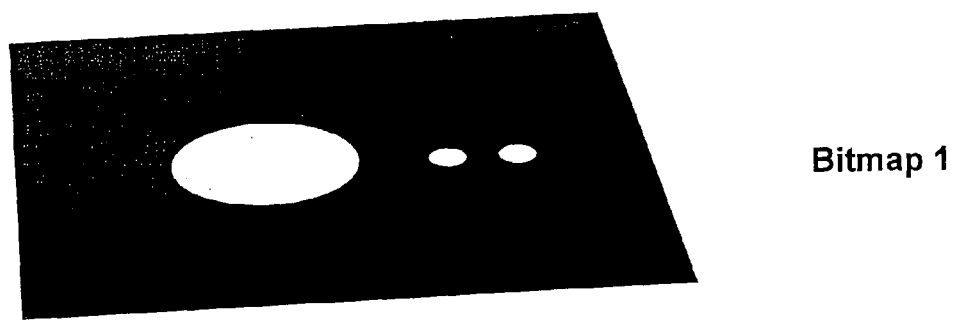
Figure 2C:
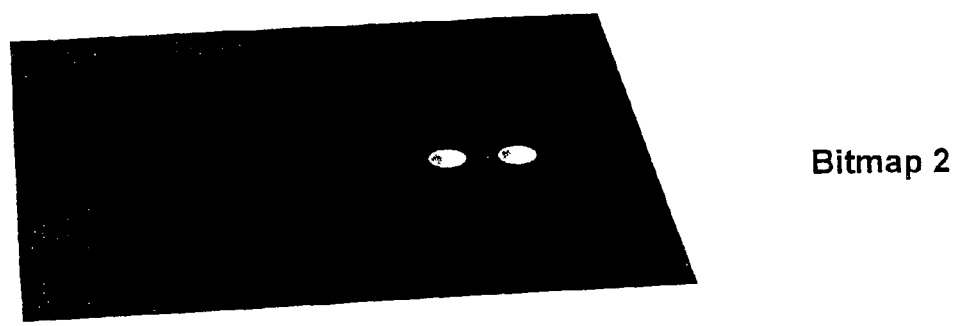

FIG. 2A shows schematically an example with a large cross-sectional area 31 and filigree cross-sectional areas 32, 33. The overall cross-sectional area for the component to be generated is indicated, in a perspective view, schematically in FIG. 2A by means of the upper cross-sectional area. Based on suitable algorithms, the structures of different area expansions 31 or, respectively, 32 and 33 are identified in the cross-sectional image, and one or multiple corresponding partial bitmap(s) 2, which lie within the overall bitmap 1 (covering the entire cross-sectional area) and superposing the latter, is (are) are generated for re-exposure of the filigree structures and provided with a corresponding exposure time. The structuring depth of the partial bitmaps will here be left to the operator.

Additionally, larger cross-sectional areas 31 can be allocated to suitable gray values precisely per pixel, whereas smaller cross-sectional areas 32, 33 are allocated to lower gray values or without gray value (i.e. white) precisely per pixel to obtain an even more uniform hardening depth (Z) and hardening expansion (XY) over the entire structure to be exposed. That is, larger structure areas are thereby darkened in accordance with their expansion.

Higher Green Compact Hardness or, Respectively, Overexposure of Massive Structures, or Higher Material Accumulations within One Component With some components, there are volume portions with an accumulation of material whose wall thickness on the one hand exceeds the maximum possible hardening depth of the material in post-hardening or which are in a position within the component not reached by light energy or only to a limited extent in the post-hardening process.

Already during the generating process, such volume portions can achieve a higher green compact hardness by being specifically overexposed. This can be carried out by multiple exposure of cross-sectional areas. Alternatively or additionally, this can also be carried out by corresponding gray value allocation of the following cross-sectional areas, wherein in the latter case, the hardening depth in Z should exceed the current solidification several-fold.

Furthermore, the exposure times for the partial bitmaps—used for the post/overexposure of the selected area—can be successively increased, depending on the desired hardening depth.

Exposure Strategy for the Reduction of Shrinkage

Figure 3A:
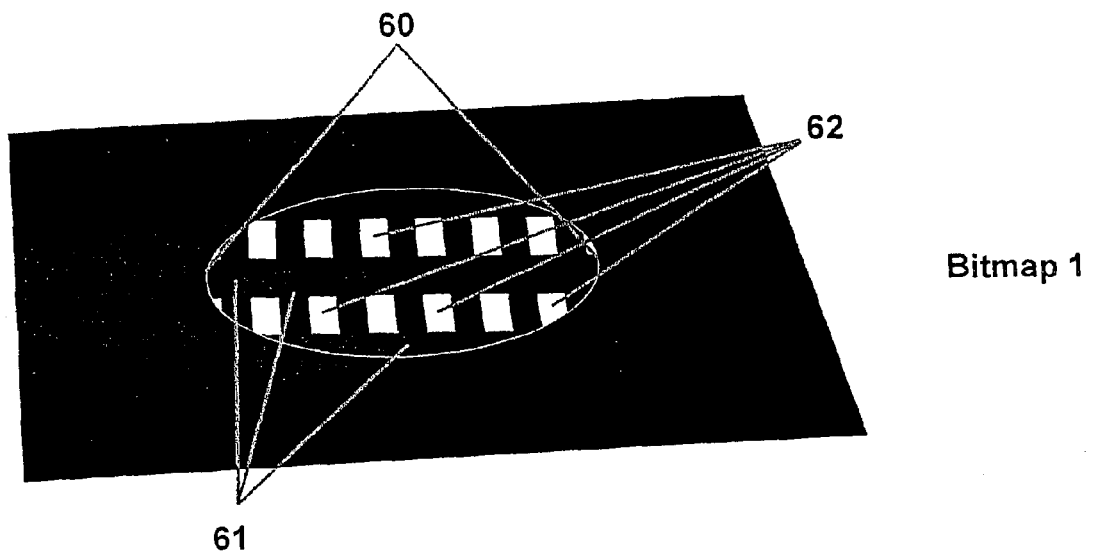
FIGS. 3A and 3B schematically illustrate a basic concept according to another embodiment of the present invention wherein a specific, predetermined cross-sectional area is irradiated in partial steps by successive bitmap patterns, including a bitmap pattern 1 (FIG. 3A) and bitmap pattern 2 (FIG. 3B)
Figure 3B:
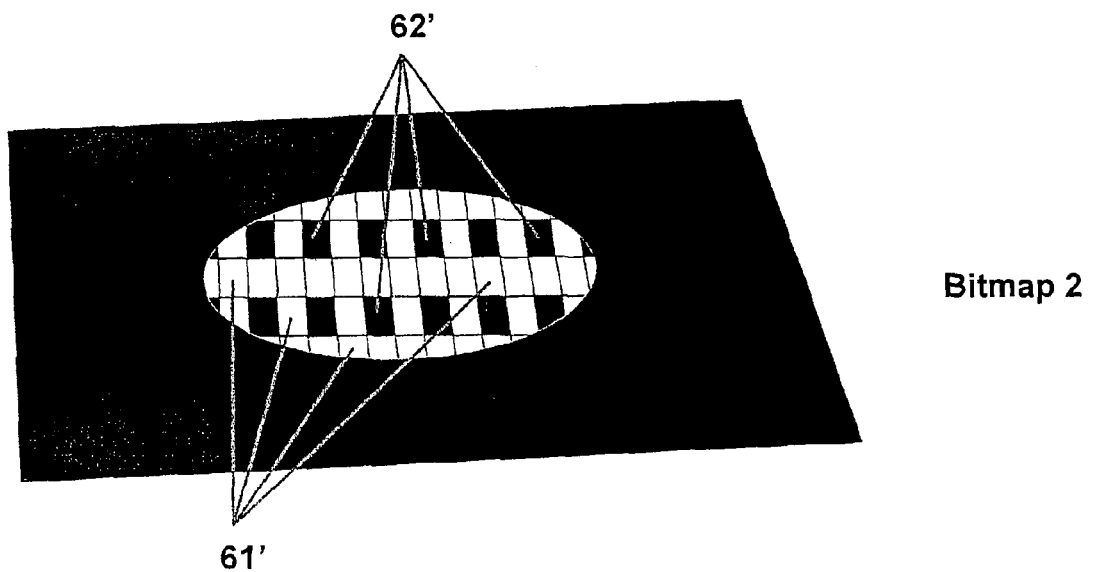

Here, the basic idea illustrated schematically in FIGS. 3A and 3B is that a predetermined cross-sectional area to be hardened (represented here by area 60 as part of a dark hatched overall cross-sectional area) is not exposed and hardened as a whole and at once, but exposed and hardened by supplementary, successive bitmap patterns, including a bitmap 1 pattern and a bitmap 2 pattern in partial steps (FIGS. 3A and 3B). As shown in FIG. 3A, the bitmap pattern 1 particularly suitably comprises, in the radiated area, a grid structure 61 having appropriate thicknesses of the respective grid strands, while the bitmap pattern 2 according to FIG. 3B fills the gaps 62 of the radiated area. Thus, the material is allowed, after the first partial hardening due to the first bitmap pattern 1, to reflow into the "spaces" formed by the material shrinkage, in order to be then hardened by the supplementary bitmap pattern 2. The respective bitmap patterns are not limited to those shown here. Also, overlapping of radiated areas of the bitmap patterns may be provided.

Exposure Strategy for Overhangs

Figure 4:
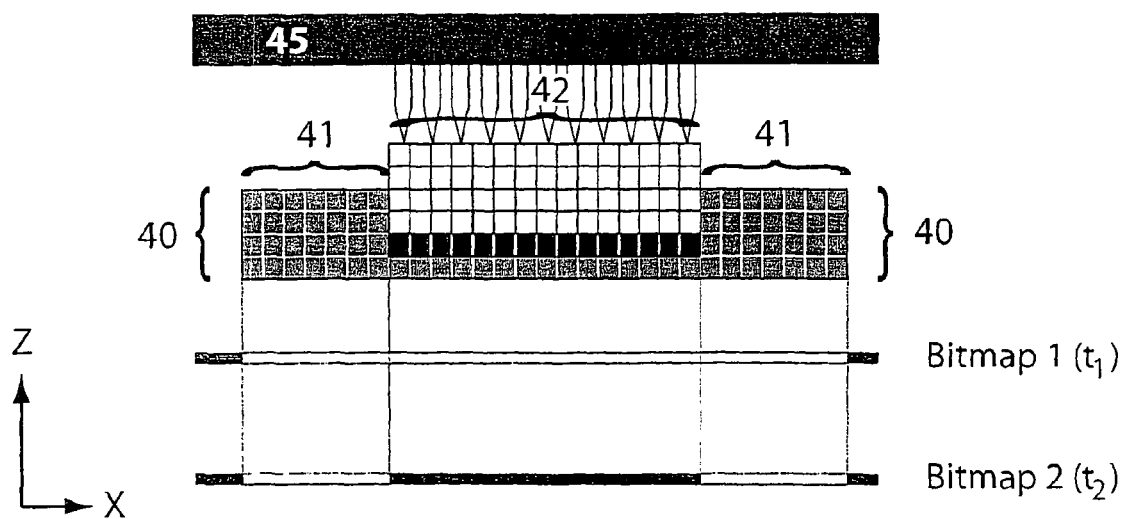
FIG. 4 schematically shows an advantageous exemplary embodiment for the stabilization of overhangs.

FIG. 4 shows schematically an advantageous exemplary embodiment for the stabilization of overhangs.

In order to be able to generate, at overhangs 41, a more stable solidification in the area of the overhang for a certain partial structure 40, e.g. the first 3 construction planes are at first left out in the overhang area in the exposure cycles so that corresponding solidifications are carried out only in the main component area 42. Only after that, the overhang area 41 will be exposed with multiple energy with the fourth exposure cycle. According to the invention, with the fourth exposure cycle, first it is exposed with the bitmap 1 exposing a total exposure area (i.e. main component area 40 and overhang areas 41 to the left and right thereof) with a predetermined exposure time $t_1$; and then, it is re-exposed with a partial bitmap 2 which only covers the overhang areas 41 left and right, with a longer exposure time $t_2$, e.g. 4 to 5 times the exposure time in comparison with the exposure time $t_1$ of bitmap 1 (see FIG. 4). Reference number 45 shows a carrier plate.

Figure 5A:
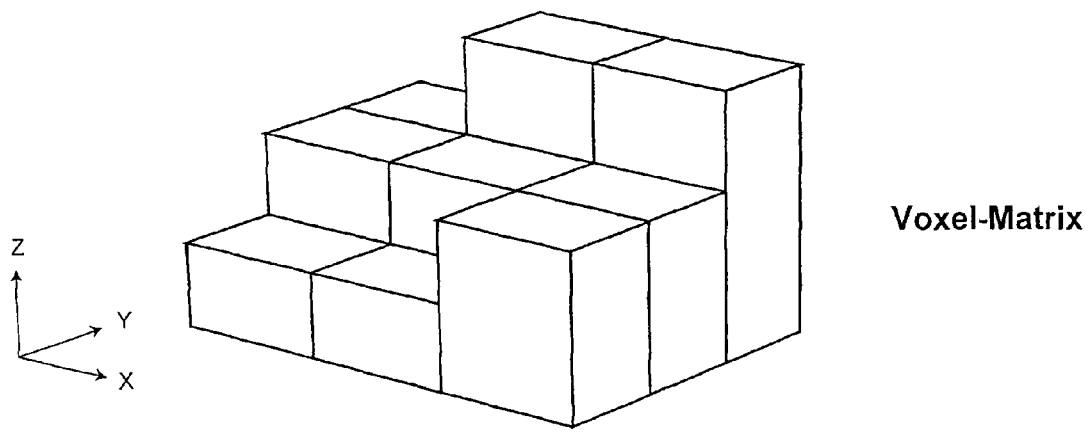
FIGS. 5A to 5C show a further advantageous exemplary embodiment for producing complex voxel matrices (FIG. 5A) while using multiple bitmaps, including a bitmap 1 (FIG. 5B) and a bitmap 2 (FIG. 5C) per X, Y cross-sectional area, in order to obtain different hardening depths in Z direction for the voxel matrix.
Figure 5B:
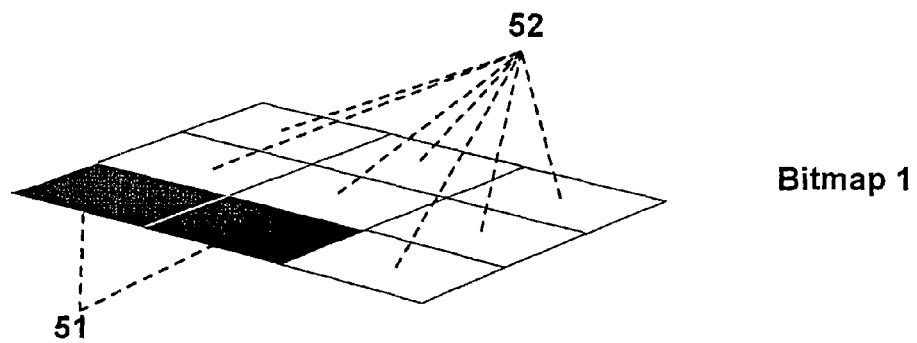
Figure 5C:
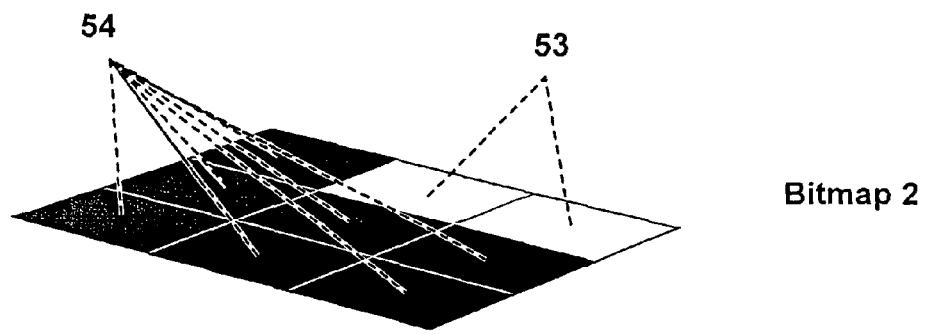

Formation of Complex Voxel Matrices by the Combination of Multiple Mask Exposure and Gray Value and/or Color Value Adjustment Another advantageous exemplary embodiment by the formation of complex voxel matrices is shown by means of FIG. 5A to 5C. This is schematically explained only on a small partial area of 3×3 pixels; however, it is clear that the same principle can also be applied to other, especially larger areas with more pixels. To obtain the voxel matrix shown in FIG. 5A with three different hardening depths, a first exposure is carried out, relative to the cross-sectional area defined by x and y, by means of a mask generated with a first bitmap 1, wherein additional gray values are allocated to the two pixels for the lowest hardening depth (indicated in the Figure front left with reference sign 51), and white is allocated to the other pixels (no gray value; indicated in the Figure by reference sign 52). Then, relative to the same cross-sectional area defined by x and y, a second exposure is carried out through a partial mask generated with a second bitmap 2, wherein white is allocated to the two pixels for the highest hardening depth (no gray value; indicated in the Figure rear right, with reference sign 53), while the other pixels are entirely darkened (black; indicated by reference sign 54 in the Figure).

As a result, a complex voxel matrix is obtained with only two exposure steps per cross-sectional area.

For all above described applications, fine adjustment within the partial bitmaps is possible through pixel-precise color channel coding, i.e. the bitmap mask/exposure mask can comprise, per pixel, additional black/white, gray value and/or color information by which the exposure intensity within the bitmap is controlled precisely per pixel. Moreover, in all applications, the exposure times per bitmap may be adjusted independent from each other so that an additional parameter is provided for the selective hardening depth of the voxel matrix.

There are no limits regarding the sequence and the design of the exposure patterns per overall mask and per partial mask of the multiple exposure according to the invention. Care should only be taken that, with each partial exposure, at least that energy will be reached which is necessary to start hardening the material or to harden it thoroughly.

The described exemplary embodiments can be randomly combined with each other. They are furthermore only exemplary and not understood as restricting by any means. Rather, they can be readily modified to realize the principle according to the invention by other embodiments.

The invention claimed is:

1. A device for producing a three-dimensional object, comprising:
    an imaging unit comprising a predetermined number of discrete imaging elements (pixels), wherein the discrete imaging elements supply electromagnetic radiation capable of solidifying a solidifiable material;
    at least one of a computer unit, an IC and a software implementation; wherein the at least one of a computer unit, an IC and a software implementation controls the exposure of a portion of the solidifiable material to energy supplied by the imaging unit in accordance with multiple successive raster masks (bitmaps), and the portion of the solidifiable material corresponds to a cross-section of the three-dimensional object.

2. A device according to claim 1, wherein the exposure of a portion of a solidifiable material to energy supplied by the imaging unit in accordance with multiple several raster masks (bitmaps) generates a matrix of volume pixels (voxels).

3. A device according to claim 1, wherein furthermore at least one of the raster masks is arranged to be controlled per image point (pixel) in terms of at least one selected from a gray value and a color value.

4. A device according to claim 1, wherein at least a part of the pixels can be allocated more than two energy levels for supplying variable energy input to a solidifiable material, wherein the more than two energy levels include: a) ON and OFF states (black/white); and b1) a predetermined number of gray levels, or b2) a predetermined number of color values.

5. A device according to claim 1, wherein the imaging unit is included in a projection unit.

6. A device according to claim 1, wherein the imaging unit is of the type of a Spatial Light Modulator (SLM).

7. A device according to claim 1, wherein the imaging unit involves an emitting point, an emitting line or an emitting matrix, comprising light valves in MEMS technology.

8. A device according to claim 1, wherein the imaging unit involves an emitting point, an emitting line or an emitting matrix, respectively comprising LEDs.

9. A device according to claim 1, wherein a shutter is further arranged between a material to be hardened and an energy source, for controlling the exposure time per raster mask.

10. A device for producing a three-dimensional object, comprising:
a raster imaging unit comprising a predetermined number of discrete imaging elements (pixels) arranged as points, lines or a matrix, wherein the imaging unit composes, from the pixels, an image related to a specific cross sectional area of the three-dimensional object to be produced;
wherein the imaging unit is designed to provide energy input for solidifying a solidifiable material under an action of electromagnetic radiation; and
wherein the imaging unit is arranged to be controlled such that at least two masks can be generated for the specific cross-sectional area of the three-dimensional object to be produced, wherein the at least two masks include: a first overall mask (bitmap 1) covering the specific cross-sectional area; and a partial mask (bitmap 2) within the overall mask.

11. A method for producing a three-dimensional object, comprising:
providing an imaging unit comprising a predetermined number of discrete imaging elements (pixels);
solidifying a solidifiable material in a matrix of volume pixels (voxels) under an action of electromagnetic radiation by means of energy input via the imaging unit; wherein with respect to a cross-sectional area of the three-dimensional object to be produced an energy input for the solidification of a volume pixel matrix in the material to be hardened is controlled by a succession of multiple raster bitmaps to influence the hardening depth per voxel (volume pixel) in the solidifiable material.

12. A method according to claim 11, wherein, for solidifying the material, the image is projected into the building plane by means of a projection unit.

13. A method according to claim 11, wherein it is determined per cross-sectional area which areas in the matrix of voxels to be hardened shall either not be exposed or shall be additionally exposed, and from this information, corresponding partial bitmaps are generated and applied for exposure.

14. A method according to claim 11, wherein, in a cross-sectional image produced per cross-sectional area, separate areas of different area expansion are identified, and for areas with smaller expansion, one or multiple additional bitmaps corresponding to the structure of the smaller area expansion is (are) produced and used for subsequent partial exposure.

15. A method according to claim 11, wherein specific structures within the object are identified for whose cross-sectional areas additional bitmaps are generated for the purpose of multiple exposure per cross-sectional area.

16. A method according to claim 11, wherein increased hardening of selected areas is carried out via single or multiple exposure, by generating and subsequently exposing with one or multiple bitmap masks having different information per cross-sectional area, wherein the achieved hardening depth of the voxels (in Z) exceeds several-fold a thickness of a current solidification in areas of multiple exposure.

17. A method according to claim 11, wherein a shutter is further used between the material to be hardened and an energy source, for controlling the exposure time per mask.

18. A method according to claim 11, wherein information in terms of at least one selected from a gray value and a color value is stored in the raster image (bitmap) per image point (pixel).

19. A method according to claim 11, wherein information in terms of at least one selected from a gray value and a color value per image point (pixel) is currently calculated online for each raster image (bitmap).

20. A method for producing a three-dimensional object, comprising:
providing an imaging unit comprising a predetermined number of discrete imaging elements (pixels);
solidifying a solidifiable material under an action of electromagnetic radiation by means of energy input via the imaging unit;
wherein the imaging unit composes, from the pixels, an image related to a cross-sectional area of the three-dimensional object, wherein at least two masks are used per cross-sectional area of the three-dimensional object, including: a first overall mask (bitmap 1) covering the cross-sectional area; and a partial mask (bitmap 2) within the overall mask.

* * * * *